United States Patent
Seong

(10) Patent No.: US 11,245,399 B1
(45) Date of Patent: Feb. 8, 2022

(54) LEVEL SHIFTERS AND SEMICONDUCTOR DEVICES INCLUDING THE SAME

(71) Applicant: Samsung Electronics Co., Ltd., Suwon-si (KR)

(72) Inventor: Ki Hwan Seong, Hwaseong-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 17/222,241

(22) Filed: Apr. 5, 2021

(30) Foreign Application Priority Data

Aug. 7, 2020 (KR) .................. 10-2020-0099229

(51) Int. Cl.
*H03K 19/00* (2006.01)
*H03K 19/0175* (2006.01)
*H03K 19/0185* (2006.01)
*H03K 3/356* (2006.01)

(52) U.S. Cl.
CPC ........... *H03K 19/018521* (2013.01); *H03K 3/356113* (2013.01); *H03K 3/356182* (2013.01)

(58) Field of Classification Search
CPC ....... H03K 19/0185; H03K 19/018507; H03K 19/018514; H03K 19/018528
See application file for complete search history.

(56) References Cited

U.S. PATENT DOCUMENTS

| 5,486,785 A * | 1/1996 | Blankenship .... H03K 3/356034 326/33 |
| 8,988,129 B2 | 3/2015 | Pelley |
| 9,246,477 B2 | 1/2016 | Li et al. |
| 10,050,625 B2 | 8/2018 | Oak et al. |
| 10,396,795 B1 | 8/2019 | Cui et al. |
| 10,505,542 B2 | 12/2019 | Finn |
| 10,615,796 B2 | 4/2020 | Zhang et al. |

FOREIGN PATENT DOCUMENTS

KR 100587689 B1 6/2006

* cited by examiner

*Primary Examiner* — Kenneth B Wells
(74) *Attorney, Agent, or Firm* — Myers Bigel, P.A.

(57) ABSTRACT

A level shifter includes an input circuit configured to generate and output first and second intermediate signals based on an input signal that transitions between a first voltage level and a second voltage level. The level shifter includes a feed forward circuit configured to receive the first intermediate signal from the input circuit and generate and output a third intermediate signal enabled in a part of a period in which the first intermediate signal is enabled and to receive the second intermediate signal from the input circuit and generate and output a fourth intermediate signal enabled in a part of a period in which the second intermediate signal is enabled. Moreover, the level shifter includes a level shifting circuit configured to receive the first through fourth intermediate signals and to shift the input signal to an output signal that transitions between a third voltage level and the second voltage level.

20 Claims, 13 Drawing Sheets

LEVEL SHIFTERS AND SEMICONDUCTOR DEVICES INCLUDING THE SAME

CROSS-REFERENCE TO RELATED APPLICATION(S)

This application claims the benefit of Korean Patent Application No. 10-2020-0099229, filed on Aug. 7, 2020, in the Korean Intellectual Property Office, the disclosure of which is incorporated herein in its entirety by reference.

BACKGROUND

1. Field

The present disclosure relates to level shifters.

2. Description of the Related Art

A level shifter is a device that shifts a swing size of an input signal and outputs the input signal with the shifted swing size as an output signal. For example, the level shifter may shift an input signal that transitions between 0 volts (V) and 0.75 V to an output signal that transitions between 0 V and 1.2 V or to an output signal that transitions between 0 V and 0.5 V.

Such a level shifter may serve as an interface between circuits that use power supply voltages of different voltage levels. Therefore, a semiconductor device or electronic device composed of circuits using power supply voltages of different voltage levels may use a level shifter for shifting from one power supply voltage level to another power supply voltage level or to a specific voltage level.

However, as the size by which an input signal needs to be shifted increases, the size of an element included in the level shifter also increases. Therefore, research is being conducted on a method of reducing the size of the level shifter while maintaining the operating performance of the level shifter.

SUMMARY

Aspects of the present disclosure provide a level shifter which can be miniaturized Aspects of the present disclosure also provide a semiconductor device which can be miniaturized.

A level shifter, according to some embodiments, may include an input circuit configured to generate and output first and second intermediate signals based on an input signal that transitions between a first voltage level and a second voltage level. The level shifter may include a feed forward circuit configured to receive the first intermediate signal from the input circuit and generate and output a third intermediate signal enabled in a part of a period in which the first intermediate signal is enabled and to receive the second intermediate signal from the input circuit and generate and output a fourth intermediate signal enabled in a part of a period in which the second intermediate signal is enabled. Moreover, the level shifter may include a level shifting circuit configured to receive the first and second intermediate signals from the input circuit and the third and fourth intermediate signals from the feed forward circuit and to shift the input signal to an output signal that transitions between a third voltage level and the second voltage level. The third voltage level may be different from the first voltage level.

A level shifter, according to some embodiments, may include a first pull-down transistor that is gated based on a first intermediate signal generated by inverting an input signal that transitions between a first voltage level and a second voltage level and is configured to pull down a voltage level of a first node to the second voltage level. The level shifter may include a second pull-down transistor that is gated based on a second intermediate signal generated by inverting the first intermediate signal and is configured to pull down a voltage level of a first output node to the second voltage level. The level shifter may include a first pull-up transistor that is gated based on the voltage level of the first node and is configured to pull up the first output node to a third voltage level greater than the first voltage level. The level shifter may include a first feed forward transistor that is gated based on a third intermediate signal generated by delaying the first intermediate signal and is configured to provide the second intermediate signal to the first node. Moreover, the level shifter may include a second feed forward transistor that is gated based on a fourth intermediate signal generated by delaying the second intermediate signal and is configured to provide the first intermediate signal to the first output node.

A level shifter, according to some embodiments, may include a first transistor that is configured to receive an input signal that transitions between a first voltage level and a second voltage level and to generate a first intermediate signal by inverting the input signal. The level shifter may include a second transistor that is configured to receive the first intermediate signal and to generate a second intermediate signal by inverting the first intermediate signal. The level shifter may include a first pull-down transistor that is gated based on the first intermediate signal and is configured to pull down a voltage level of a first node to the second voltage level. The level shifter may include a second pull-down transistor that is gated based on the second intermediate signal and is configured to pull down a voltage level of a first output node to the second voltage level. The level shifter may include a first pull-up transistor that is gated based on the voltage level of the first node and is configured to pull up the first output node to a third voltage level different from the first voltage level. The level shifter may include a first feed forward transistor that is gated based on a third intermediate signal and is configured to provide the second intermediate signal to the first node. Moreover, the level shifter may include a second feed forward transistor that is gated based on a fourth intermediate signal and is configured to provide the first intermediate signal to the first output node. A threshold voltage of the first transistor may be smaller than a threshold voltage of the second pull-down transistor.

A semiconductor device, according to some embodiments, may include a logic circuit that is configured to generate a first signal that transitions between a first voltage level corresponding to a first voltage and a second voltage level by using the first voltage. The semiconductor device may include a level shifter that is configured to receive the first signal and to shift the first signal to a second signal that transitions between a third voltage level and the second voltage level. The third voltage level may be different from the first voltage level. Moreover, the semiconductor device may include an input/output (I/O) circuit that is configured to buffer the second signal by using a second voltage corresponding to the third voltage level. The level shifter may include: an input circuit that is configured to generate and output a first intermediate signal from the first signal and a second intermediate signal different from the first intermediate signal; a feed forward circuit that is configured to receive the first intermediate signal from the input circuit and to generate and output a third intermediate signal enabled in a part of a period in which the first intermediate signal is enabled; and a level shifting circuit that is configured to receive the first and second intermediate signals from the input circuit and the third intermediate signal from the feed forward circuit and to shift the first signal to the second signal.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Hereinafter, embodiments according to the present disclosure will be described with reference to the accompanying drawings.

Figure 1:
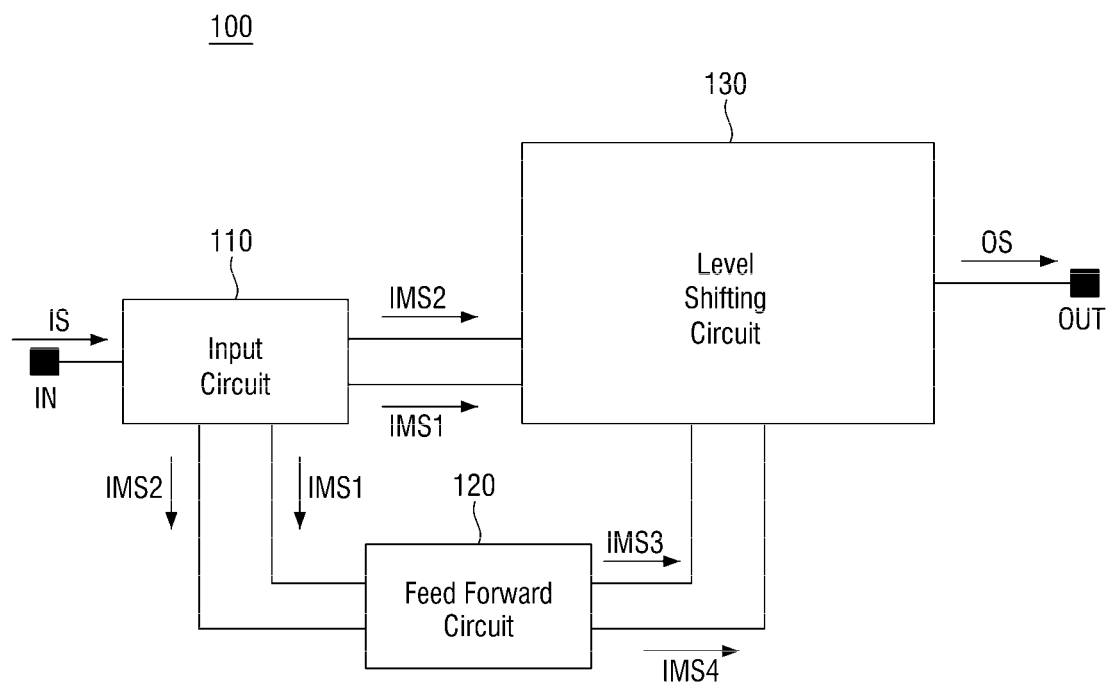
FIG. 1 is a block diagram of a level shifter according to some embodiments.
Figure 2:
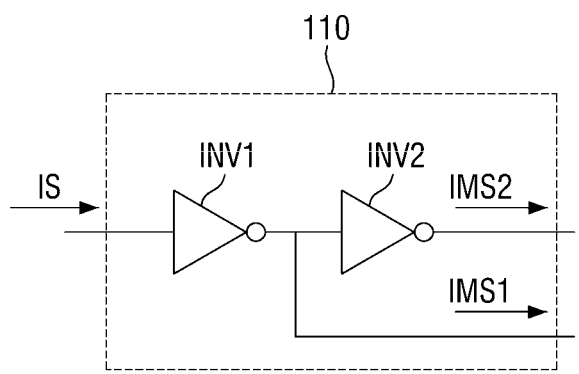
FIG. 2 is a circuit diagram of an input circuit of FIG. 1.
Figure 3:
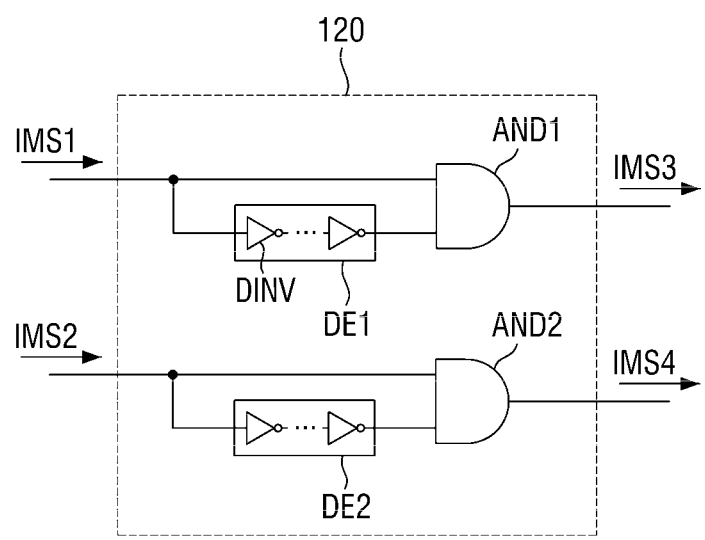
FIG. 3 is a circuit diagram of a feed forward circuit of FIG. 1.
Figure 4:
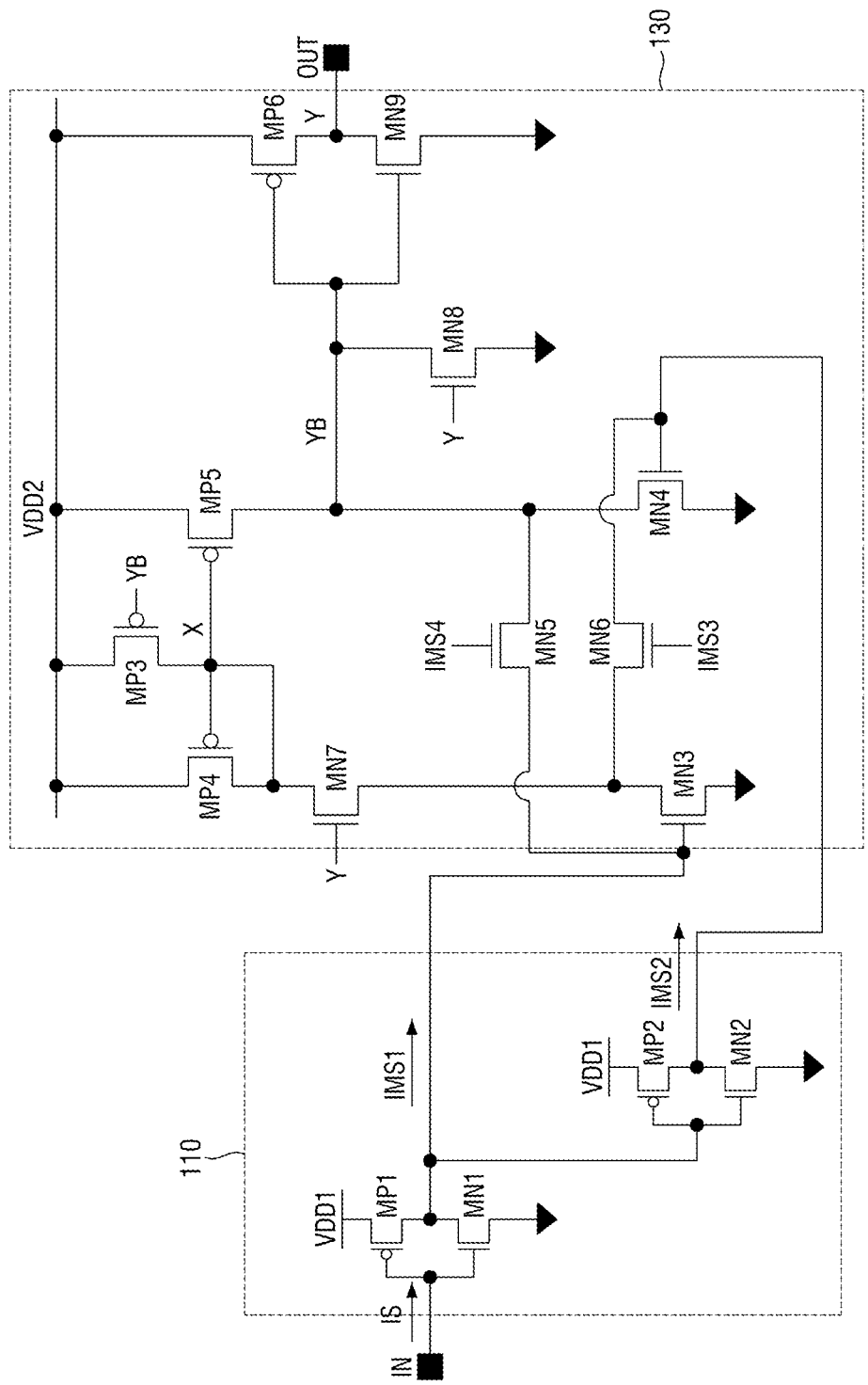
FIG. 4 is a circuit diagram of the input circuit and a level shifting circuit of FIG. 1.

FIG. 1 is a block diagram of a level shifter 100 according to some embodiments. FIG. 2 is a circuit diagram of an input circuit 110 of FIG. 1. FIG. 3 is a circuit diagram of a feed forward circuit 120 of FIG. 1. FIG. 4 is a circuit diagram of the input circuit 110 and a level shifting circuit 130 of FIG. 1.

Referring to FIGS. 1 through 4, the level shifter 100 may include the input circuit 110, the feed forward circuit 120, and the level shifting circuit 130.

The input circuit 110 may receive an input signal IS provided to an input terminal IN. The input circuit 110 may generate intermediate signals IMS1 and IMS2 from (e.g., based on/responsive to) the input signal IS.

Figure 7:
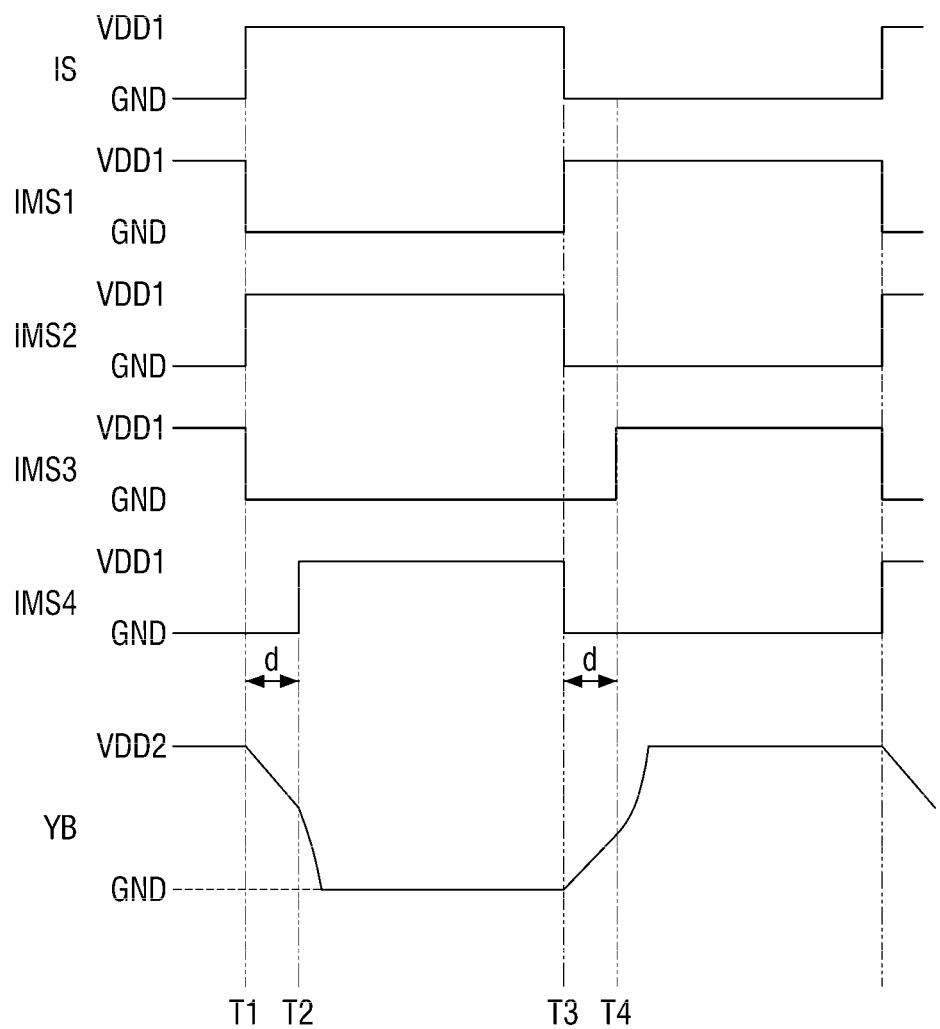
FIG. 7 is a timing diagram illustrating the operation of the level shifter according to some embodiments.

The input signal IS may transition between a first voltage level (e.g., VDD1, shown in FIG. 4) and a second voltage level (e.g., a ground voltage GND, shown in FIG. 7). That is, when the input signal IS is at a logic high level (hereinafter, referred to as an H level), the input signal IS may have a voltage value of VDD1. When the input signal IS is at a logic low level (hereinafter, referred to as an L level), the input signal IS may have a ground voltage GND value.

When the input signal IS is as described above, the intermediate signals IMS1 and IMS2 generated by the input circuit 110 may also have the same signal level as the input signal IS. Specifically, when the intermediate signals IMS1 and IMS2 are at the H level, they may have a voltage value of VDD1. When the intermediate signals IMS1 and IMS2 are at the L level, they may have a ground voltage GND value. That is, the input circuit 110 does not shift the level of the input signal IS.

In some embodiments, the input circuit 110 may generate the intermediate signal IMS1 by performing a first logical operation on the input signal IS and may generate the intermediate signal IMS2 by performing a second logical operation on the intermediate signal IMS1.

A case where the input circuit 110 generates the intermediate signal IMS1 by inverting the input signal IS and generates the intermediate signal IMS2 by inverting the intermediate signal IMS1 will be described below as an example, but embodiments are not limited thereto.

Referring to FIG. 2, the input circuit 110 may include inverters INV1 and INVS2.

The inverter INV1 and the inverter INV2 may be connected in series as illustrated in the drawing.

The inverter INV1 may output the intermediate signal IMS1 by inverting the input signal IS, and the inverter INV2 may output the intermediate signal IMS2 by inverting the intermediate signal IMS1.

Accordingly, the signal level of the intermediate signal IMS1 is opposite to that of the input signal IS. That is, when the input signal IS is at the H level, the intermediate signal IMS1 is at the L level. When the input signal IS is at the L level, the intermediate signal IMS1 is at the H level. On the other hand, the signal level of the intermediate signal IMS2 is the same as that of the input signal IS. That is, when the input signal IS is at the H level, the intermediate signal IMS2 is also at the H level. When the input signal IS is at the L level, the intermediate signal IMS2 is also at the L level.

Referring again to FIG. 1, the intermediate signals IMS1 and IMS2 generated by the input circuit 110 may be provided to the feed forward circuit 120 and the level shifting circuit 130.

The feed forward circuit 120 may generate intermediate signals IMS3 and IMS4 from the intermediate signals IMS1 and IMS2 provided by the input circuit 110. The intermediate signals IMS3 and IMS4 may be provided to the level shifting circuit 130 to perform a feed forward function. This will be described in more detail later.

When the input signal IS is a signal that transitions between VDD1 and the ground voltage GND, the intermediate signals IMS3 and IMS4 generated by the feed forward circuit 120 may also have the same signal level as the input signal IS. Specifically, when the intermediate signals IMS3 and IMS4 are at the H level, they may have a voltage value of VDD1. When the intermediate signals IMS3 and IMS4 are at the L level, they may have a ground voltage GND value. That is, the feed forward circuit 120 does not shift the level of the input signal IS or the intermediate signals IMS1 and IMS2.

Although a case where the input signal IS and the intermediate signals IMS1 through IMS4 are signals that transition between VDD1 and the ground voltage GND has been described above as an example, embodiments are not limited thereto. In some embodiments, the input signal IS and the intermediate signals IMS1 through IMS4 may also be signals that transition between VDD1 and another voltage (which may be referred to as "VSS"), not the ground voltage GND. Here, VSS can be modified as long as it is smaller than VDD1.

In some embodiments, the feed forward circuit 120 may generate the intermediate signal IMS3 by performing a third logical operation on the intermediate signal IMS1 and generate the intermediate signal IMS4 by performing a fourth logical operation on the intermediate signal IMS2.

A case where the feed forward circuit 120 generates the intermediate signal IMS3 by performing an AND operation on the intermediate signal IMS1 and a signal obtained by delaying the intermediate signal IMS1 and generates the intermediate signal IMS4 by performing an AND operation on the intermediate signal IMS2 and a signal obtained by delaying the intermediate signal IMS2 will be described below as an example, but embodiments are not limited thereto.

Referring to FIG. 3, the feed forward circuit 120 may include delay units DE1 and DE2 and AND gates AND1 and AND2.

The delay unit DE1 may receive the intermediate signal IMS1, delay the intermediate signal IMS1 for a predetermined time, and then output the delayed intermediate signal IMS1.

The AND gate AND1 may receive the intermediate signal IMS1 and an output (e.g., the delayed intermediate signal IMS1) of the delay unit DE1 and may output the result of performing an AND operation on them as the intermediate signal IMS3.

Accordingly, the intermediate signal IMS3 may be enabled in a part of a period in which the intermediate signal IMS1 is enabled (hereinafter, an enabled period will be described as a period in which a signal maintains the H level).

For example, referring to FIG. 7, the intermediate signal IMS3 may be enabled in the period in which the intermediate signal IMS1 is enabled, excluding a delay time d. Accordingly, a time when the intermediate signal IMS1 is enabled is faster/earlier than a time when the intermediate signal IMS3 is enabled, and a time when the intermediate signal IMS1 is disabled (hereinafter, a time when a signal becomes the L level will be described as an example) is substantially the same as a time when the intermediate signal IMS3 is disabled. Here, "substantially the same" means that disable times of two signals may slightly differ due to the process margin of the circuit or a delay due to wiring but are not made different by a separate delay circuit.

Similarly, the delay unit DE2 may receive the intermediate signal IMS2, delay the intermediate signal IMS2 for a predetermined time, and then output the delayed intermediate signal IMS2.

The AND gate AND2 may receive the intermediate signal IMS2 and an output (e.g., the delayed intermediate signal IMS2) of the delay unit DE2 and may output the result of performing an AND operation on them as the intermediate signal IMS4.

Accordingly, the intermediate signal IMS4 may be enabled in a part of a period in which the intermediate signal IMS2 is enabled.

For example, referring to FIG. 7, the intermediate signal IMS4 may be enabled in the period in which the intermediate signal IMS2 is enabled, excluding the delay time d.

Accordingly, a time when the intermediate signal IMS2 is enabled is faster/earlier than a time when the intermediate signal IMS4 is enabled, and a time when the intermediate signal IMS2 is disabled is substantially the same as a time when the intermediate signal IMS4 is disabled.

In some embodiments, each of the delay unit DE1 and the delay unit DE2 may include a delay line implemented as a plurality of delay inverters DINV. However, embodiments are not limited thereto.

The level shifting circuit 130 may receive the intermediate signals IMS1 and IMS2 from the input circuit 110 and the intermediate signals IMS3 and IMS4 from the feed forward circuit 120 and shift the input signal IS.

Specifically, the level shifting circuit 130 may shift the input signal IS that transitions between VDD1 and the ground voltage GND to an output signal OS that transitions between VDD2 and the ground voltage GND by using the intermediate signals IMS1 through IMS4. In some embodiments, VDD2 may be a power supply voltage greater than VDD1, but embodiments are not limited thereto. In addition, as described above, the level shifting circuit 130 may shift the input signal IS that transitions between VDD1 and VSS to the output signal OS that transitions between VDD2 and VSS by using the intermediate signals IMS1 through IMS4.

Referring to FIG. 4, the input circuit 110 may include a plurality of transistors MN1, MN2, MP1 and MP2, and the level shifting circuit 130 may include a plurality of transistors MN3 through MN9 and MP3 through MP6.

The transistors MN1 and MP1 included in the input circuit 110 may correspond to the inverter INV1 (see FIG. 2) described above, and the transistors MN2 and MP2 may correspond to the inverter INV2 (see FIG. 2) described above.

The power supply voltage VDD1 may be provided to the input circuit 110. Although a detailed circuit diagram of circuit elements included in the feed forward circuit 120 (see FIG. 3) is omitted from FIG. 4, the power supply voltage VDD1 may also be provided to the feed forward circuit 120 (see FIG. 3).

The transistors MN1 and MP1 may output the intermediate signal IMS1 by inverting the input signal IS input to the input terminal IN. The transistor MP1 and the transistor MN1 may be connected in series between the power supply voltage VDD1 and a ground terminal.

The transistors MN2 and MP2 may output the intermediate signal IMS2 by inverting the intermediate signal IMS1. The transistor MP2 and the transistor MN2 may be connected in series between the power supply voltage VDD1 and the ground terminal.

The power supply voltage VDD2 may be provided to the level shifting circuit 130. In some embodiments, the power supply voltage VDD2 may be greater than the power supply voltage VDD1. Specifically, the power supply voltage VDD1 may be, for example, 0.7 to 0.8 V, and the power supply voltage VDD2 may be, for example, 1.1 to 1.3 V. However, embodiments are not limited thereto.

The transistor MN3 may be gated based on the first intermediate signal IMS1, and the transistor MN4 may be gated based on the second intermediate signal IMS2.

The transistor MN3 may be turned on to connect a node X and the ground terminal through the transistor MN7. That is, the transistor MN3 may be turned on to operate as a pull-down transistor that pulls down the voltage level of the node X (e.g., down to the ground voltage GND).

The transistor MN4 may be turned on to connect an output node YB and the ground terminal. That is, the transistor MN4 may be turned on to operate as a pull-down transistor that pulls down the voltage level of the output node YB (e.g., down to the ground voltage GND).

The transistor MN5 may be connected between a gate terminal of the transistor MN3 and the output node YB. The transistor MN5 may be gated based on the intermediate signal IMS4 to provide the intermediate signal IMS1 to the output node YB. Since a feed forwarding path through which the intermediate signal IMS1 is provided to the output node YB is formed when the transistor MN5 is turned on, the transistor MN5 may operate as a feed forward transistor.

The transistor MN6 may be connected between a gate terminal of the transistor MN4 and the node X. The transistor MN6 may be gated based on the intermediate signal IMS3 to provide the intermediate signal IMS2 to the node X. Since a feed forwarding path through which the intermediate signal IMS2 is provided to the node X is formed when the transistor MN6 is turned on, the transistor MN6 may operate as a feed forward transistor.

Although only an embodiment in which the transistors MN5 and MN6 operating as feed forward transistors are included in the level shifting circuit 130 is illustrated in the drawing, embodiments are not limited thereto. The embodiment may also be modified to an embodiment in which the transistors MN5 and MN6 are included in the feed forward circuit 120.

The transistor MP4 may be gated based on the voltage level of the node X, and the transistor MP5 may also be gated based on the voltage level of the node X.

The transistor MP4 may be turned on to connect the node X and the power supply voltage VDD2. That is, the transistor MP4 may be turned on to operate as a pull-up transistor that pulls up the voltage level of the node X.

The transistor MP5 may be turned on to connect the output node YB and the power supply voltage VDD2. That is, the transistor MP5 may be turned on to operate as a pull-up transistor that pulls up the voltage level of the output node YB (e.g., up to the power supply voltage VDD2).

The transistor MN7 may be gated based on the inverted voltage level of the output node YB (or the voltage level of an output node Y) to connect the node X and the ground terminal. In an embodiment, the transistor MN7 may operate as a pull-down transistor that pulls down the voltage level of the node X (e.g., down to the ground voltage GND).

The transistor MP3 may be gated based on the voltage level of the output node YB to connect the node X and the power supply voltage VDD2. In an embodiment, the transistor MP3 may operate as a keeper transistor that maintains the voltage level of the node X at the power supply voltage VDD2.

The transistor MN8 may be gated based on the inverted voltage level of the output node YB (or the voltage level of the output node Y) to connect the output node YB and the ground terminal. In an embodiment, the transistor MN8 may operate as a keeper transistor that maintains the voltage level of the output node YB at the ground voltage GND.

The transistors MP6 and MN9 may invert the voltage level of the output node YB and provide it to the output node Y. That is, the transistors MP6 and MN9 may operate as an inverter. Accordingly, the voltage level of the output node YB may be inverted and output to an output terminal OUT in the form of the output signal OS.

As described above, when the input signal IS and the intermediate signals IMS1 through IMS4 are signals that transition between VDD1 and VSS and the output signal OS is a signal that transitions between VDD2 and VSS, the configuration of the circuit may be modified such that VSS is supplied to the ground terminal of the illustrated circuit.

In addition, although N-type transistors and P-type transistors are distinguished in the drawing, embodiments are not limited thereto. When the forms of the intermediate signals IMS1 through IMS4 are modified, the types of transistors may also be modified.

Referring to FIG. 4, in some embodiments, the transistors MN1, MN2, MP1 and MP2 included in the input circuit 110 and the transistors MN3 through MN9 and MP3 through MP6 included in the level shifting circuit 130 may be turned on at different threshold voltages.

For example, if the power supply voltage VDD2 provided to the level shifting circuit 130 is greater than the power supply voltage VDD1 provided to the input circuit 110 as in the illustrated example, threshold voltages of the transistors MN3 through MN9 and MP3 through MP6 included in the level shifting circuit 130 may be greater than threshold voltages of the transistors MN1, MN2, MP1 and MP2 included in the input circuit 110 to improve circuit driving capability.

Specifically, the threshold voltages of the transistors MN3 and MN5 which receive the intermediate signal IMS1 may be greater than the threshold voltages of the transistors MP1 and MN1 which provide the intermediate signal IMS1, and the threshold voltages of the transistors MN4 and MN6 which receive the intermediate signal IMS2 may be greater than the threshold voltages of the transistors MP2 and MN2 which provide the intermediate signal IMS2.

More specifically, the threshold voltages of the transistors MN3 through MN9 and MP3 through MP6 included in the level shifting circuit 130 may be, for example, 1 to 1.5 V, and the threshold voltages of the transistors MN1, MN2, MP1 and MP2 included in the input circuit 110 may be, for example, 0.5 to 1 V. However, embodiments are not limited thereto.

Although not illustrated in detail, transistors included in the feed forward circuit 120 and the transistors MN3 through MN9 and MP3 through MP6 included in the level shifting circuit 130 may also have different threshold voltages.

Specifically, the threshold voltages of the transistors MN3 through MN9 and MP3 through MP6 included in the level shifting circuit 130 may be greater than the threshold voltages of the transistors included in the feed forward circuit 120 to improve the circuit driving capability.

In some embodiments, the transistors MN1, MN2, MP1 and MP2 included in the input circuit 110 and the transistors MN3 through MN9 and MP3 through MP6 included in the level shifting circuit 130 may have different sizes.

For example, if the power supply voltage VDD2 provided to the level shifting circuit 130 is greater than the power supply voltage VDD1 provided to the input circuit 110 as in the illustrated example, sizes of the transistors MN3 through MN9 and MP3 through MP6 included in the level shifting circuit 130 may be larger than sizes of the transistors MN1, MN2, MP1 and MP2 included in the input circuit 110 to improve the circuit driving capability.

This will now be described in more detail with reference to FIGS. 5 and 6.

Figure 5:
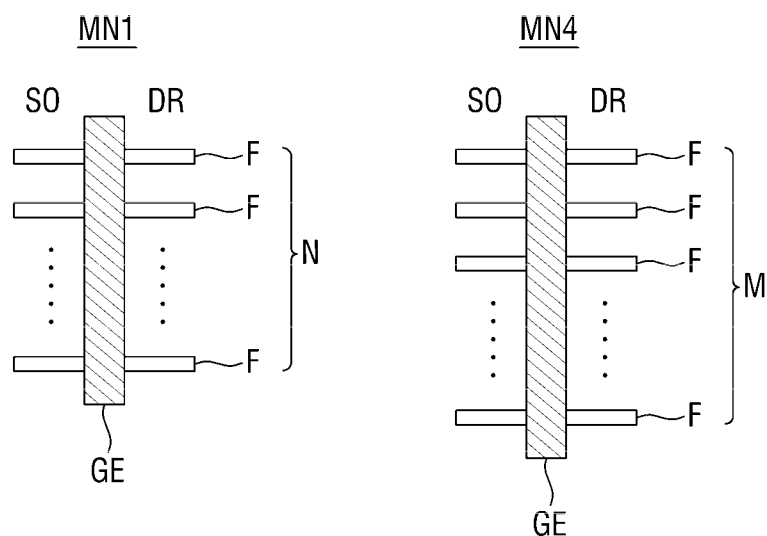
FIGS. 5 and 6 are diagrams comparing sizes of transistors illustrated in FIG. 4.
Figure 6:
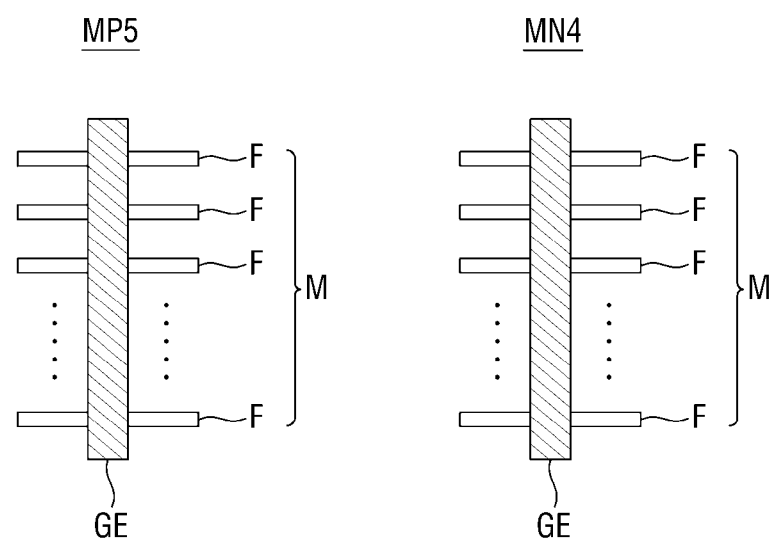

FIGS. 5 and 6 are diagrams comparing the sizes of the transistors illustrated in FIG. 4.

First, FIG. 5 is a diagram comparing the size of the transistor MN4 included in the level shifting circuit 130 with the size of the transistor MN1 included in the input circuit 110. The following description may also be applied to other transistors included in the level shifting circuit 130 and other transistors included in the input circuit 110.

Referring to FIG. 5, in some embodiments, each of the transistor MN4 and the transistor MN1 may include a fin field-effect transistor (FinFET).

A gate electrode GE constituting the transistor MN4 may extend while conformally covering a plurality of fins F, each having a source SO and a drain DR, and may overlap M fins F.

A gate electrode GE constituting the transistor MN1 may also extend while conformally covering a plurality of fins F, each having a source SO and a drain DR, and may overlap N fins F.

When the power supply voltage VDD2 is greater than the power supply voltage VDD1 as described above, M may be greater than N. That is, the transistor MN4 may include (e.g., have a gate electrode GE that overlaps) a larger number of fins F than the transistor MN1.

Next, FIG. 6 is a diagram comparing the size of the transistor MN4 and the size of the transistor MP5 included in the level shifting circuit 130.

Referring to FIG. 6, in some embodiments, each of the transistor MN4 and the transistor MP5 may include a FinFET.

The gate electrode GE constituting the transistor MN4 may extend while conformally covering a plurality of fins F, each having the source SO and the drain DR, and may overlap M fins F.

A gate electrode GE constituting the transistor MP5 may also extend while conformally covering a plurality of fins F, each having a source SO and a drain DR, and may overlap M fins F.

In the level shifting circuit 130 according to the current embodiment, the transistor MN4 and the transistor MP5 may have substantially the same size as described above. Here, the fact that the transistor MN4 and the transistor MP5 have substantially the same size is a concept including a change in size according to a process variation. That is, although the transistor MN4 and the transistor MP5 are designed to have the same size, size changes that occur in the process of forming the transistor MN4 and the transistor MP5 may be treated as being substantially the same for each transistor.

In the current embodiment, the transistor MN4 and the transistor MP5 may include (e.g., have a gate electrode GE that overlaps) the same number of fins F. This may be the effect of the feed forward circuit 120 and the feed forward transistor MN5 described above.

If the feed forward circuit 120 and the feed forward transistor MN5 do not exist (i.e., are absent from the level shifter 100), the transistor MN4 may have to be formed larger than the transistor MP5 to improve its driving capability. That is, the number of fins F included in the transistor MN4 may have to be larger than the number of fins F included in the transistor MP5.

In the current embodiment, however, since the driving capability of the transistor MN4 is improved by the feed forward circuit 120 and the feed forward transistor MN5, the size of the transistor MN4 can be reduced.

Although not illustrated in detail, in the level shifting circuit 130 according to the current embodiment, the transistor MN3 and the transistor MP4 may also have substantially the same size. That is, the transistor MN3 and the transistor MP4 may include (e.g., have a gate electrode GE that overlaps) the same number of fins F, which may also be the effect of the feed forward circuit 120 and the feed forward transistor MN6 described above.

If the feed forward circuit 120 and the feed forward transistor MN6 do not exist (i.e., are absent from the level shifter 100), the transistor MN3 may have to be formed larger than the transistor MP4 to improve its driving capability. That is, the number of fins F included in the transistor MN3 may have to be larger than the number of fins F included in the transistor MP4.

In the current embodiment, however, since the driving capability of the transistor MN3 is improved by the feed forward circuit 120 and the feed forward transistor MN6, the size of the transistor MN3 can be reduced.

The operation of the level shifter 100 will now be described with reference to FIGS. 3 and 7 through 11.

FIG. 7 is a timing diagram illustrating the operation of the level shifter 100 according to some embodiments. FIGS. 8 through 11 are diagrams for explaining the operation of the level shifter 100 according to some embodiments.

FIG. 7 illustrates timing of voltage levels of the input signal IS, the intermediate signals IMS1 through IMS4, and the output node YB. A minute/small delay between the input signal IS and the intermediate signals IMS1 and IMS2 is ignored, and the voltage level of the output node YB is rather exaggerated in the drawing for ease of description. In the following description, a signal will be regarded as being enabled when transitioning to the H level and as being disabled when transitioning to the L level. However, embodiments are not limited thereto.

Figure 8:
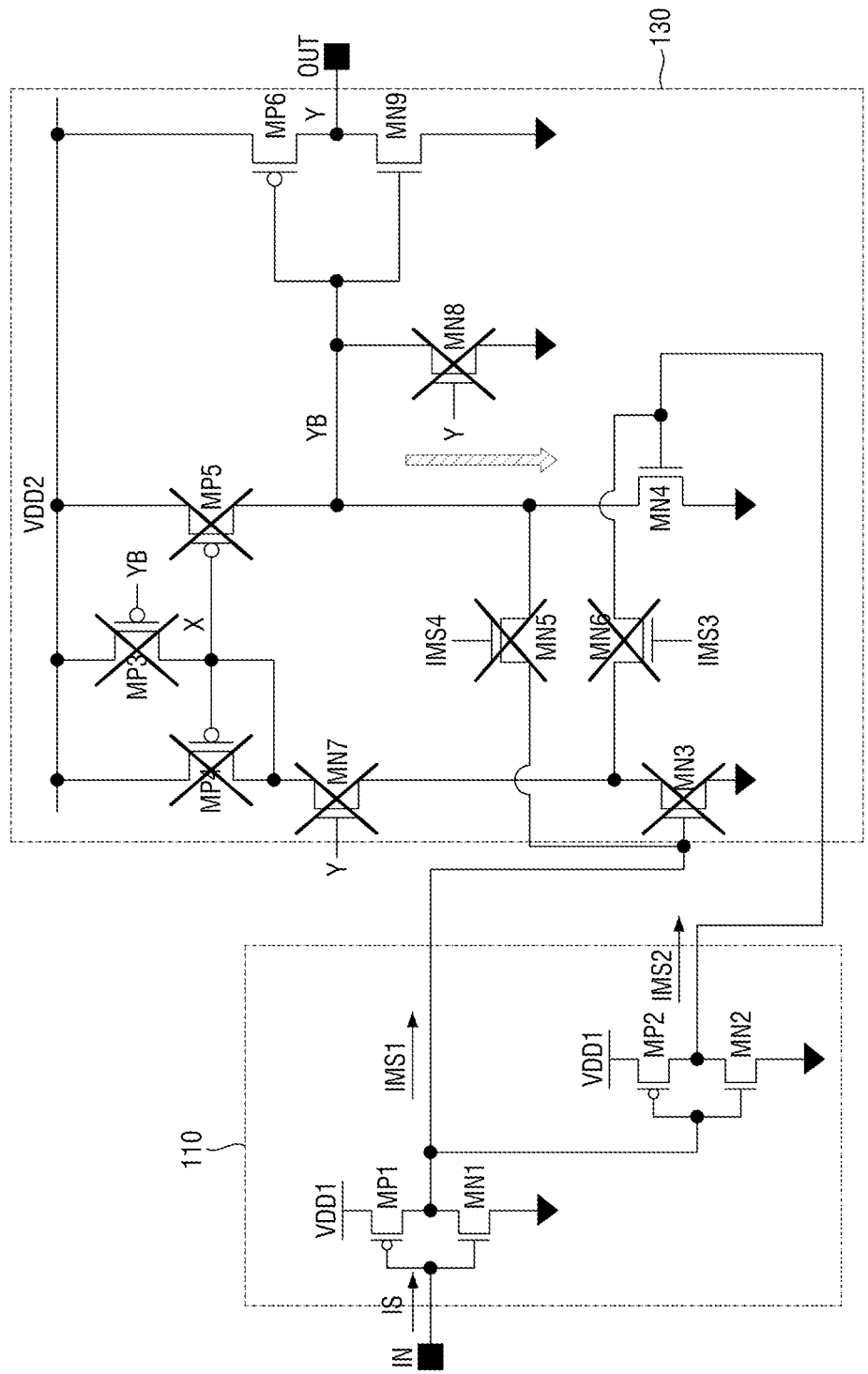
FIGS. 8 through 11 are diagrams for explaining the operation of the level shifter according to some embodiments.

Referring to FIGS. 3, 7 and 8, at a first time T1, the input signal IS transitions to the H level and is enabled. When the input signal IS becomes the H level, the intermediate signal IMS1 transitions to the L level and is disabled, and the intermediate signal IMS2 transitions to the H level and is enabled.

Since the intermediate signal IMS1 is at the L level, an output of the AND gate AND1 of the feed forward circuit 120 is at the L level. Therefore, the intermediate signal IMS3 transitions to the L level.

Although the intermediate signal IMS2 is at the H level, an output of the delay unit DE2 is at the L level while the intermediate signal IMS2 is delayed by the delay unit DE2. Therefore, an output of the AND gate AND2 of the feed forward circuit 120 is also at the L level. Accordingly, the intermediate signal IMS4 maintains the L level.

Since the intermediate signal IMS1 is at the L level, the transistor MN3 is turned off. Since the intermediate signal IMS2 is at the H level, the transistor MN4 is turned on. As the transistor MN4 is turned on, the output node YB is connected to the ground terminal. Accordingly, the voltage level of the output node YB starts to fall with a first slope.

Since the voltage level of the output node YB was at the H level at the first time T1, the transistors MN7 and MN8 are kept turned off. In addition, the transistors MP3 through MP5 are kept turned off.

Figure 9:
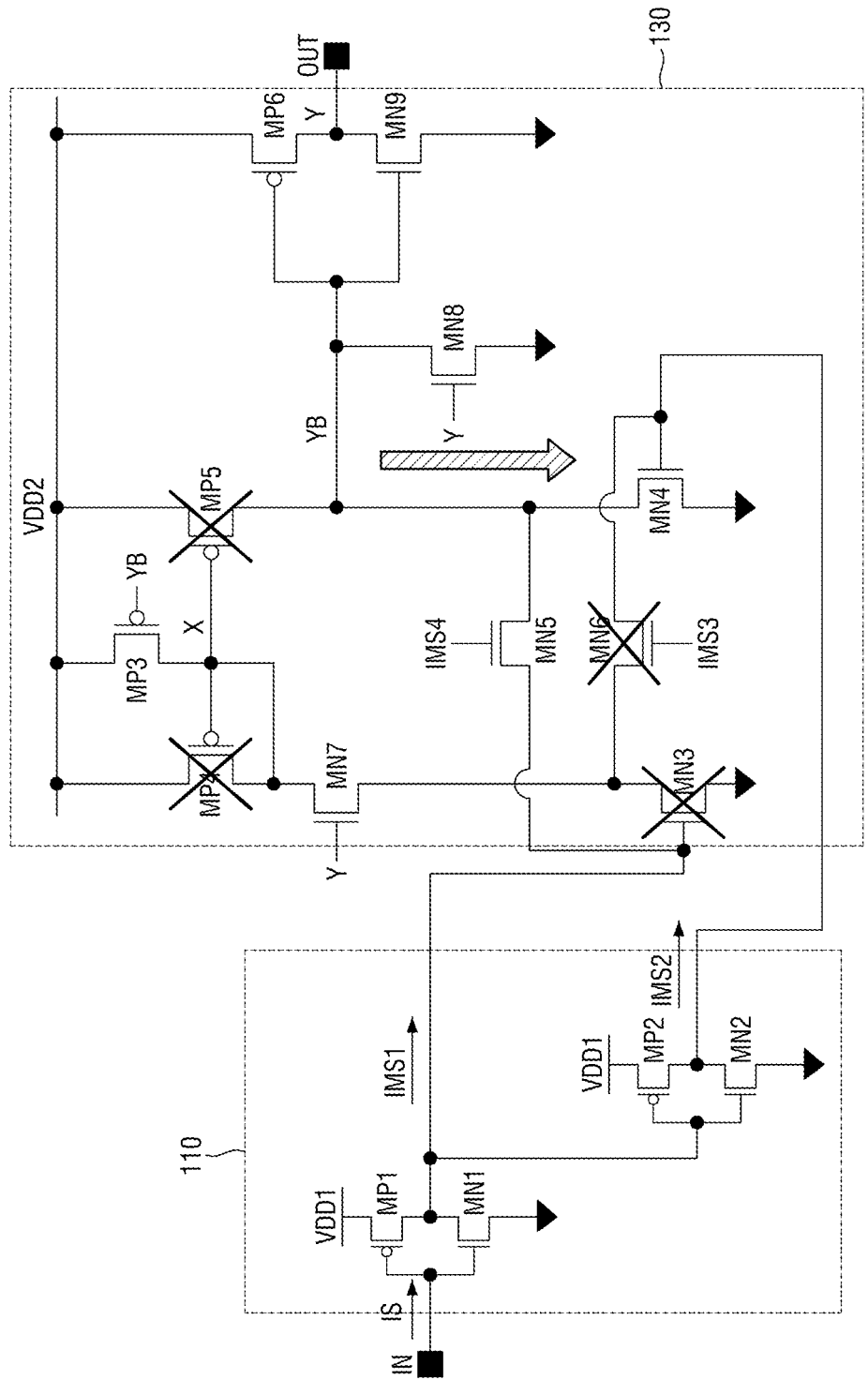

Next, referring to FIGS. 3, 7 and 9, at a second time T2 delayed from the first time T1 by the delay time d, the output of the delay unit DE2 becomes the H level. Therefore, the output of the AND gate AND2 of the feed forward circuit 120 becomes the H level. Accordingly, the intermediate signal IMS4 becomes the H level.

Since the intermediate signal IMS4 is at the H level, the transistor MN5 is turned on. Accordingly, the intermediate signal IMS1 at the L level is provided to the output node YB. When such a feed forward path is formed, the voltage level of the output node YB falls more steeply. That is, the voltage level of the output node YB falls with a second slope greater than the first slope described above.

As the voltage level of the output node YB falls rapidly, the transistor MN8 is turned on to connect the output node YB and the ground terminal. In addition, the transistor MP3 is turned on to supply the power supply voltage VDD2 to the node X. In addition, the transistor MN7 is turned on. Since the power supply voltage VDD2 is supplied to the node X, the transistors MP4 and MP5 are kept turned off.

When a sufficient time elapses from the second time T2, the output node YB transitions to the ground voltage GND level. Accordingly, the output signal OS having the level of the power supply voltage VDD2 is output to the output terminal OUT by the transistors MP6 and MN9.

Figure 10:
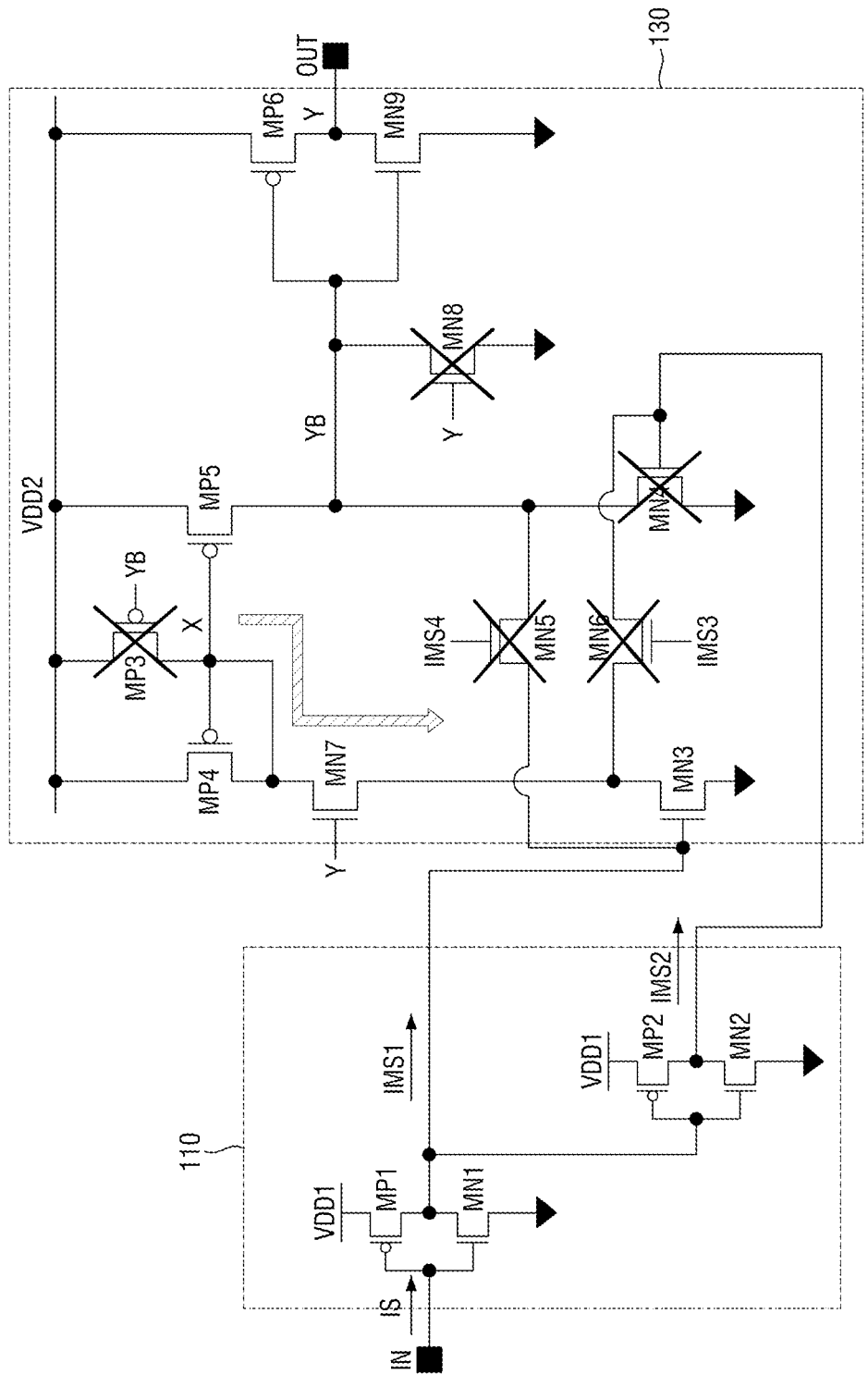

Next, referring to FIGS. 3, 7 and 10, at a third time T3, the input signal IS transitions to the L level and is disabled. When the input signal IS becomes the L level, the intermediate signal IMS1 transitions to the H level and is enabled, and the intermediate signal IMS2 becomes the L level and is disabled.

Since the intermediate signal IMS2 is at the L level, the output of the AND gate AND2 of the feed forward circuit 120 is at the L level. Therefore, the intermediate signal IMS4 transitions to the L level.

Although the intermediate signal IMS1 is at the H level, the output of the delay unit DE1 is at the L level while the intermediate signal IMS1 is delayed by the delay unit DE1. Therefore, the output of the AND gate AND1 of the feed forward circuit 120 is also at the L level. Accordingly, the intermediate signal IMS3 maintains the L level.

Since the intermediate signal IMS2 is at the L level, the transistor MN4 is turned off. Since the intermediate signal IMS1 is at the H level, the transistor MN3 is turned on. Since the output node YB still maintains the ground voltage GND level, the transistor MN7 is kept turned off. Accordingly, the node X is connected to the ground terminal, and the voltage level of the node X falls.

As the voltage level of the node X falls, the transistors MP4 and MP5 are turned on. As the transistor MP5 is turned on, the power supply voltage VDD2 is supplied to the output node YB, and thus the voltage level of the output node YB starts to rise with a third slope. As the voltage level of the output node YB rises, the transistor MP3 and the transistor MN8 are turned off.

Figure 11:
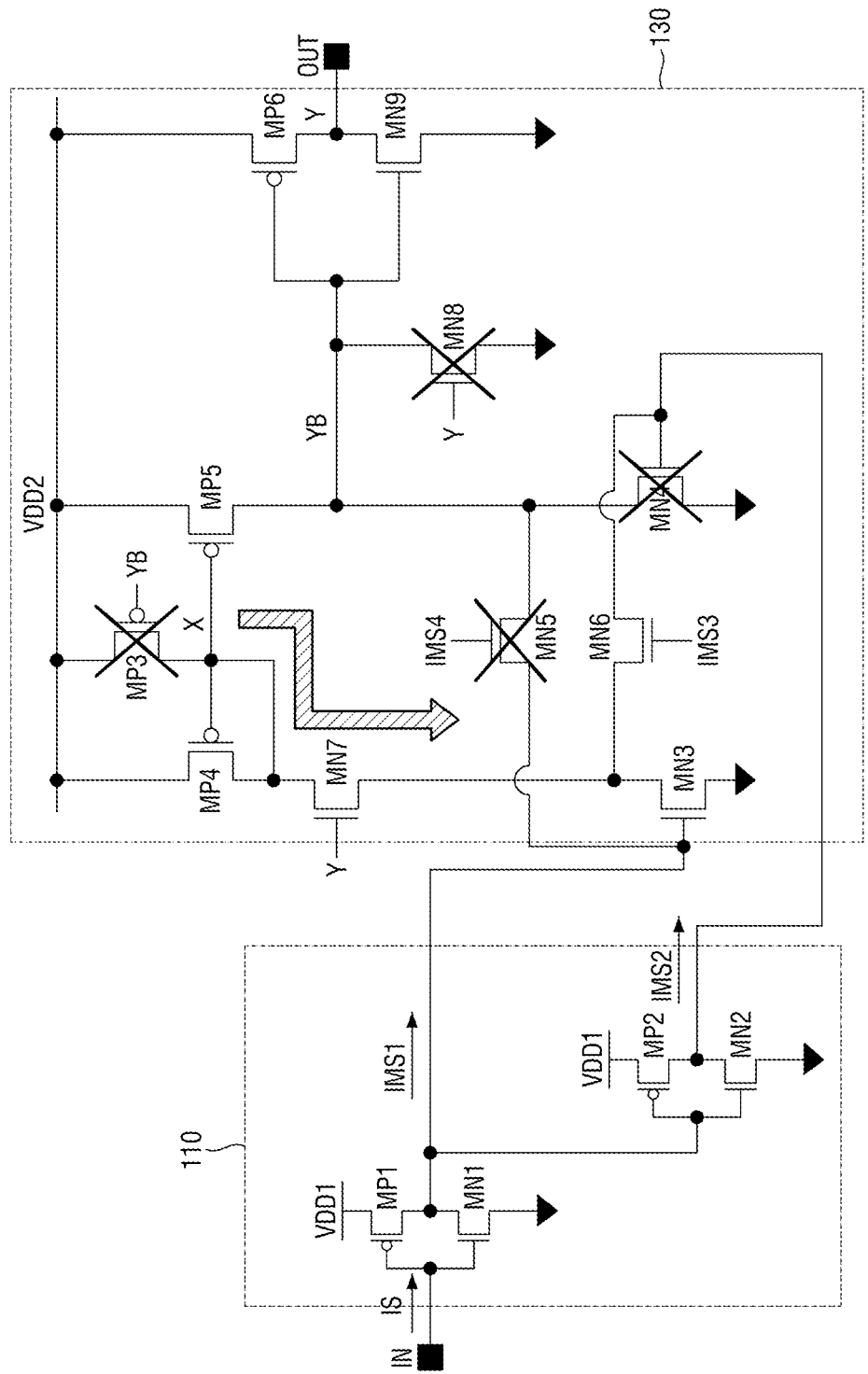

Next, referring to FIGS. 3, 7 and 11, at a fourth time T4 delayed from the third time T3 by the delay time d, the output of the delay unit DE1 becomes the H level. Therefore, the output of the AND gate AND1 of the feed forward circuit 120 becomes the H level. Accordingly, the intermediate signal IMS3 becomes the H level.

Since the intermediate signal IMS3 is at the H level, the transistor MN6 is turned on. Accordingly, the intermediate signal IMS2 at the L level is provided to the node X. When such a feed forward path is formed, the voltage level of the node X falls more steeply. Therefore, the voltage level of the output node YB rises with a fourth slope greater than the third slope described above.

When a sufficient time elapses from the fourth time T4, the output node YB transitions to the level of the power supply voltage VDD2. Accordingly, the output signal OS having the ground voltage GND level is output to the output terminal OUT by the transistors MP6 and MN9.

As described above, in the current embodiment, a level shifting operation is performed more efficiently by forming a feed forward path in a level shifting process. Accordingly, the driving load of the transistors MN3 and MN4 can be reduced, thereby lowering the threshold voltages of the transistors MN3 and MN4 and reducing the sizes of the transistors MN3 and MN4. That is, a miniaturized level shifter can be manufactured.

Although an embodiment in which the level shifting circuit 130 receives the first and second intermediate signals IMS1 and IMS2 through the input circuit 110 has been described above, embodiments are not limited thereto. In some embodiments, the level shifting circuit 130 may also operate by simultaneously receiving a first signal provided to the input terminal IN and a second signal obtained by inverting the first signal directly without passing through the input circuit 110. In this case, the feed forward circuit 120 may generate the feed forward signals described above based on the first signal and the second signal.

Figure 12:
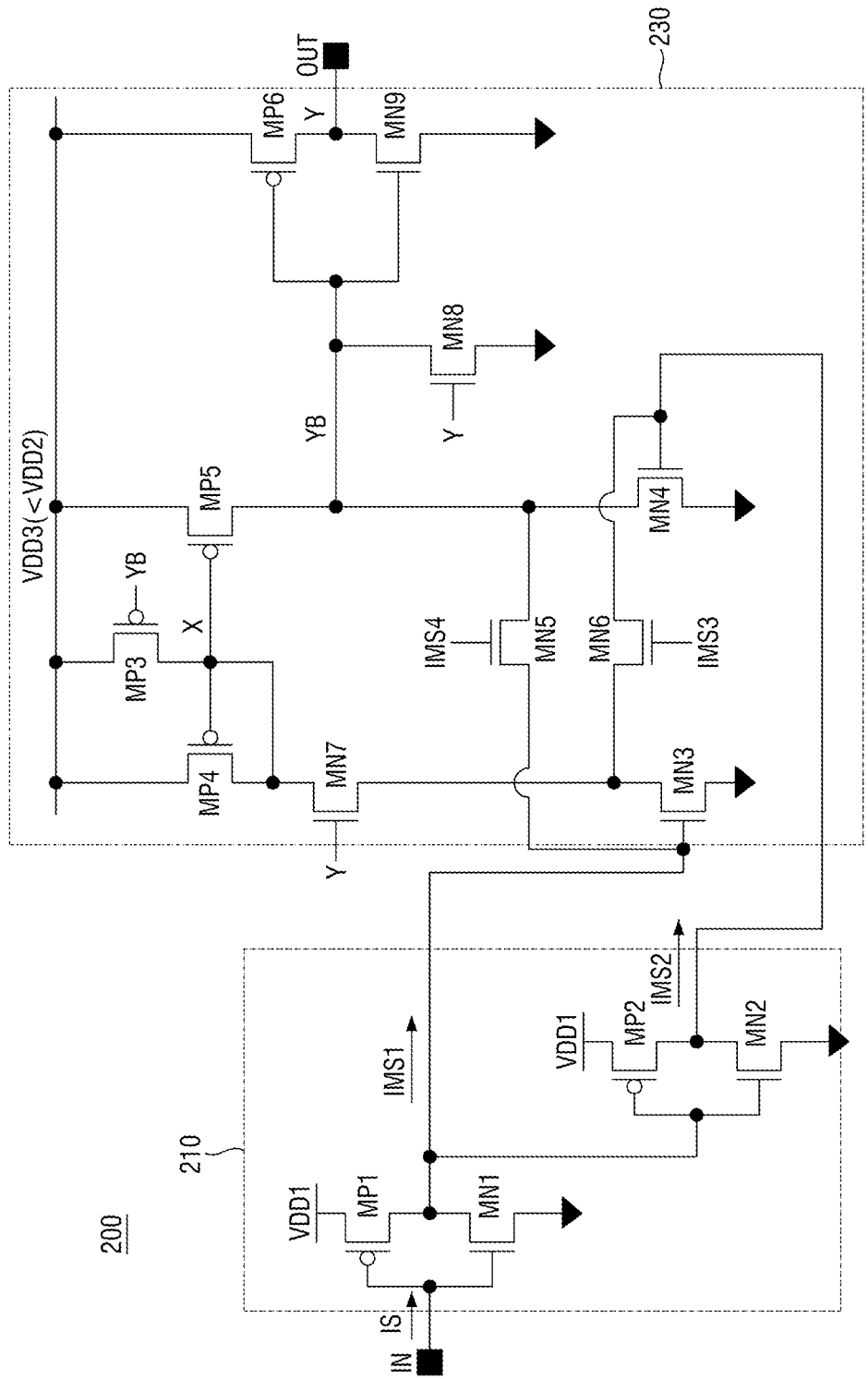
FIG. 12 is a circuit diagram of a level shifter according to some embodiments.

FIG. 12 is a circuit diagram of a level shifter 200 according to some embodiments.

Differences from the above-described embodiments will be mainly described below.

Referring to FIG. 12, the level shifter 200 includes an input circuit 210 and a level shifting circuit 230. Although not illustrated in detail, the level shifter 200 may include a feed forward circuit which generates intermediate signals IMS3 and IMS4.

A power supply voltage VDD3 may be provided to the level shifting circuit 230. Here, the power supply voltage VDD3 may be a voltage lower than the power supply voltage VDD2 provided to the level shifting circuit 130 (see FIG. 4) described above.

In some embodiments, when the power supply voltage VDD2 is, for example, 1.1 to 1.3 V, the power supply voltage VDD3 may be 0.9 to 1.0 V. However, embodiments are not limited thereto.

In some embodiments, transistors MN1, MN2, MP1 and MP2 included in the input circuit 210 and transistors MN3 through MN9 and MP3 through MP6 included in the level shifting circuit 230 may be turned on at substantially the same threshold voltage.

Here, "substantially the same" is a concept including a change in threshold voltage according to a process variation. That is, although the transistors MN1, MN2, MP1 and MP2 included in the input circuit 210 and the transistors MN3 through MN9 and MP3 through MP6 included in the level shifting circuit 230 are designed to have the same threshold voltage, minute/small threshold voltage changes that occur in the process of forming the transistors may be treated as being substantially the same for each transistor.

In some embodiments, the transistors MN1, MN2, MP1 and MP2 included in the input circuit 210 and the transistors MN3 through MN9 and MP3 through MP6 included in the level shifting circuit 230 may have substantially the same size.

If the transistors MN1, MN2, MP1 and MP2 included in the input circuit 210 and the transistors MN3 through MN9 and MP3 through MP6 included in the level shifting circuit 230 include FinFETs, they may be configured to include the same number of fins.

Figure 13:
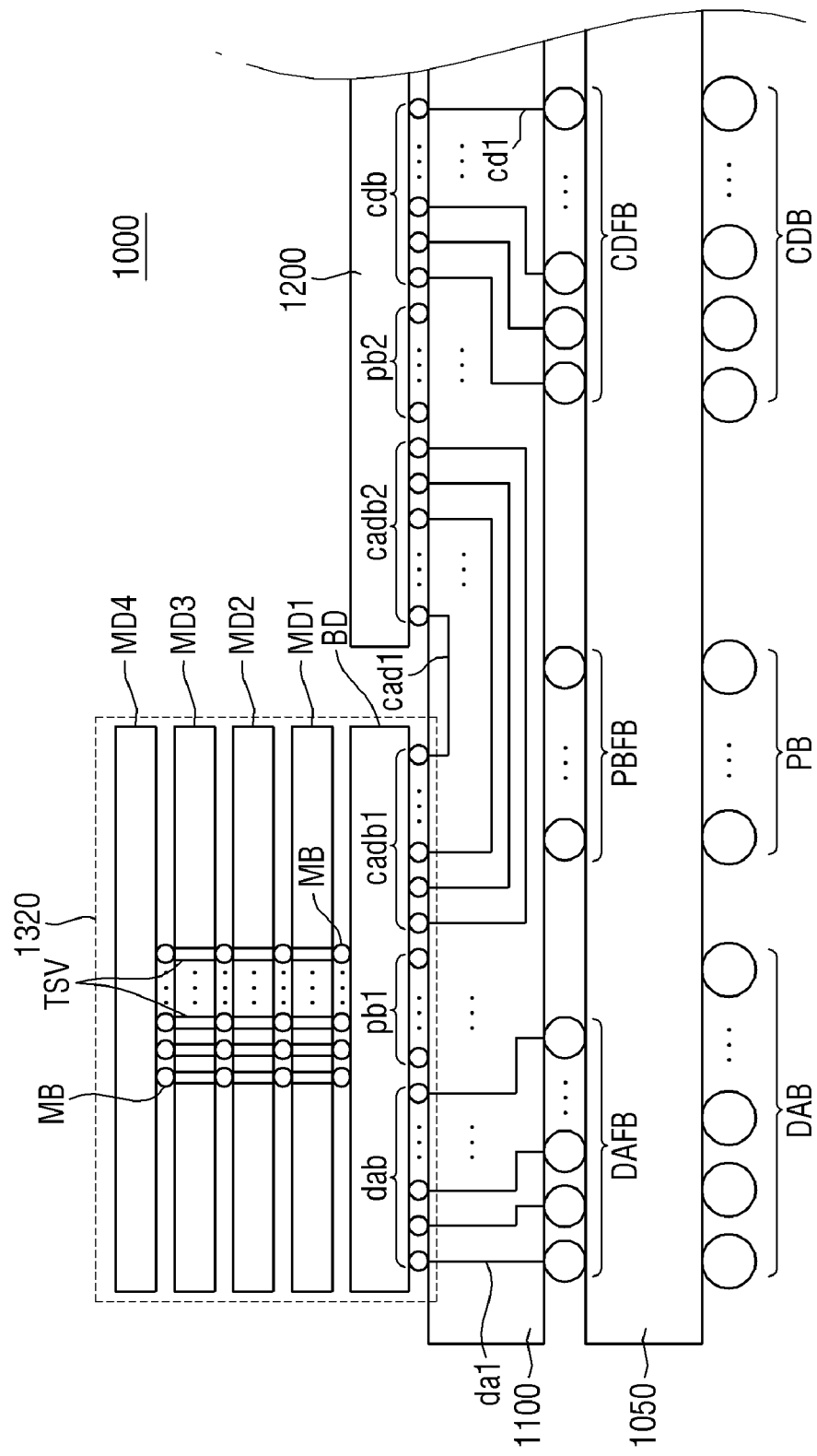
FIG. 13 is a cross-sectional view of a semiconductor device according to some embodiments.

FIG. 13 is a partial cross-sectional view of a semiconductor device 1000 according to some embodiments.

Referring to FIG. 13, the semiconductor device 1000 may include, for example, a memory device. Specifically, the semiconductor device 1000 may include a high bandwidth memory (HBM).

The semiconductor device 1000 may include a base substrate 1050, an interposer 1100, a logic chip 1200, and a memory chip 1320. Although one memory chip 1320 is illustrated in the drawing, the semiconductor device 1000 may include a plurality of memory chips. In some embodiments, the memory chips may be arranged symmetrically to each other with respect to the logic chip 1200.

The memory chip 1320 may be disposed on a side surface of the interposer 1100, and the logic chip 1200 may be disposed on a center of an upper surface of the interposer 1100. The logic chip 1200 may control the memory chip 1320.

The memory chip 1320 may include memory dies MD1 through MD4 and a base die BD (or a buffer die). The memory dies MD1 through MD4 and the base die BD may be sequentially staked as illustrated in FIG. 13.

The memory dies MD1 through MD4 may be stacked on the base die BD. First bumps MB may be disposed between the stacked memory dies MD1 through MD4 and the base die BD, and through silicon vias TSV may penetrate the memory dies MD1 through MD4 while electrically connecting the first bumps MB to each other.

A conductive through electrode may be disposed in each of the through silicon vias TSV. The through electrode may include, but is not limited to, at least one of, e.g., aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), and zirconium (Zr).

First direct access (DA) bumps dab, first power bumps pb1, and first command and address bumps and data bumps cadb1 may be disposed on a lower surface of the base die BD.

Although only the memory chip 1320 is illustrated in FIG. 13, the other unillustrated memory chips of the semiconductor device 1000 may have the same structure as the illustrated structure.

Second command and address bumps and data bumps cadb2, second power bumps pb2, and first control signal and data bumps cdb may be disposed on a lower surface of the logic chip 1200.

The logic chip 1200 may be, for example, a graphics processing unit (GPU) die, a central processing unit (CPU) die, or a system on chip (SoC).

The first bumps MB, the first DA bumps dab, the first and second power bumps pb1 and pb2, the first and second command and address bumps and data bumps cadb1 and cadb2, and the first control signal and data bumps cdb may be, but are not limited to, micro-bumps.

Second DA bumps DAFB, third power bumps PBFB, and second control signal and data bumps CDFB may be disposed on a lower surface of the interposer 1100.

The second DA bumps DAFB, the third power bumps PBFB, and the second control signal and data bumps CDFB may include, but are not limited to, at least one of, e.g., tin (Sn), indium (In), lead (Pb), zinc (Zn), nickel (Ni), gold (Au), silver (Ag), copper (Cu), antimony (Sb), bismuth (Bi), and combinations of the same.

The interposer 1100 may include DA lines dal connecting the first DA bumps dab and the second DA bumps DAFB, command and address lines and data lines cad1 connecting the first command and address bumps and data bumps cadb1 and the second command and address bumps and data bumps cadb2, and control signal and data lines cdl connecting the first control signal and data bumps cdb and the second control signal and data bumps CDFB.

Although not illustrated in detail, the interposer 1100 may additionally include power lines connecting the first power bumps pb1 and the third power bumps PBFB and connecting the second power bumps pb2 and the third power bumps PBFB.

The interposer 1100 may include, but is not limited to, at least one of silicon, glass, ceramic, and plastic.

The second DA bumps DAFB, the third power bumps PBFB, and the second control signal and data bumps CDFB may be, but are not limited to, flip die bumps.

DA balls DAB, power balls PB, and control signal and data balls CDB may be disposed on a lower surface of the base substrate 1050.

The DA balls DAB, the power balls PB, and the control signal and data balls CDB may include, but are not limited to, at least one of, e.g., tin (Sn), indium (In), lead (Pb), zinc (Zn), nickel (Ni), gold (Au), silver (Ag), copper (Cu), antimony (Sb), bismuth (Bi), and combinations of the same.

In the base substrate 1050, the second DA bumps DAFB may be connected to the DA balls DAB, the third power bumps PBFB may be connected to the power balls PB, and the second control signal and data bumps CDFB may be connected to the control signal and data balls CDB.

The base substrate 1050 may be, but is not limited to, a printed circuit board (PCB) or a ceramic substrate.

When the base substrate 1050 is a PCB, it may be made of at least one material selected from phenolic resin, epoxy resin, and polyimide. For example, the base substrate 1050 may include at least one material selected from FR4, tetrafunctional epoxy, polyphenylene ether, epoxy/polyphenylene oxide, bismaleimide triazine (BT), thermount, cyanate ester, polyimide, and liquid crystal polymer. A surface of the base substrate 1050 may be covered by solder resist, but the invention of the present disclosure is not limited to this case.

The logic chip 1200 may process data in response to a control signal received through the second control signal and data bumps CDFB, generate the processed data as channel data, and transmit the channel data to the base die BD through the first command and address bumps and data bumps cadb1, together with channel commands and addresses.

Figure 14:
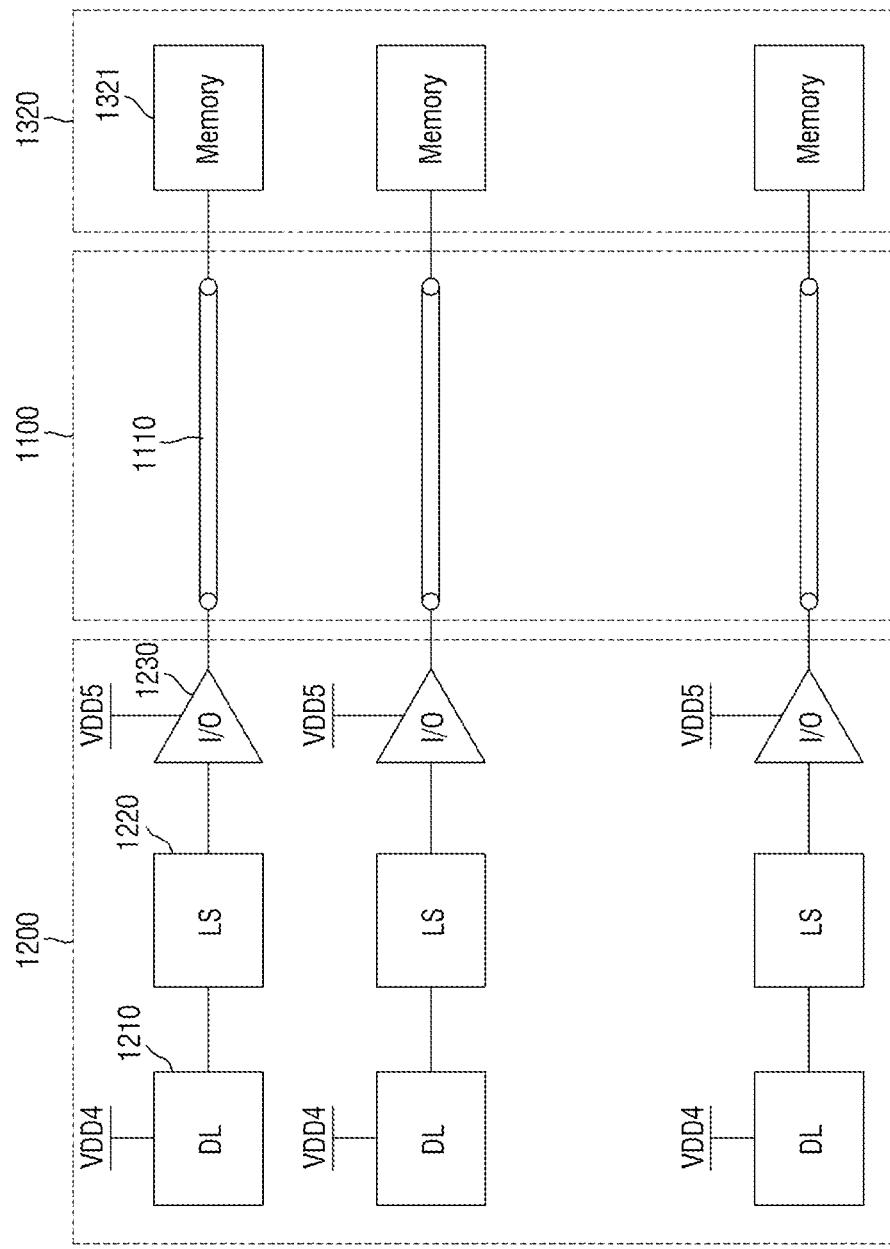
FIG. 14 is a block diagram of the semiconductor device of FIG. 13.

FIG. 14 is a block diagram of the semiconductor device 1000 of FIG. 13.

Referring to FIG. 14, the logic chip 1200 may include a plurality of input/output (I/O) circuits 1230. The I/O circuits 1230 may be connected to a plurality of wirings 1110 disposed in the interposer 1100, respectively. The wirings 1110 disposed in the interposer 1100 may be connected to a plurality of memory elements 1321 disposed in the memory chip 1320, respectively.

Level shifters (LS) 1220 may transfer signals between digital logic (DL) circuits 1210 and the I/O circuits 1230. For example, each of the digital logic circuits 1210 may output a first signal which transitions between the level of a power supply voltage VDD4 and a ground voltage GND level, and each of the level shifters 1220 may shift the first signal to a second signal which transitions between the level of a power supply voltage VDD5 and the ground voltage GND level. The second signal may be transmitted to each memory element 1321 through an I/O circuit 1230 and a wiring 1110 disposed in the interposer 1100.

If the first signal is not shifted to the second signal by a level shifter 1220, it may fail to meet interface specifications. Thus, an I/O circuit 1230 cannot output the first signal to a memory element 1321 through a wiring 1110 disposed in the interposer 1100.

In some embodiments, the configuration of each level shifter 1220 may employ the configurations of the level shifters 100 and 200 described above.

Figure 15:
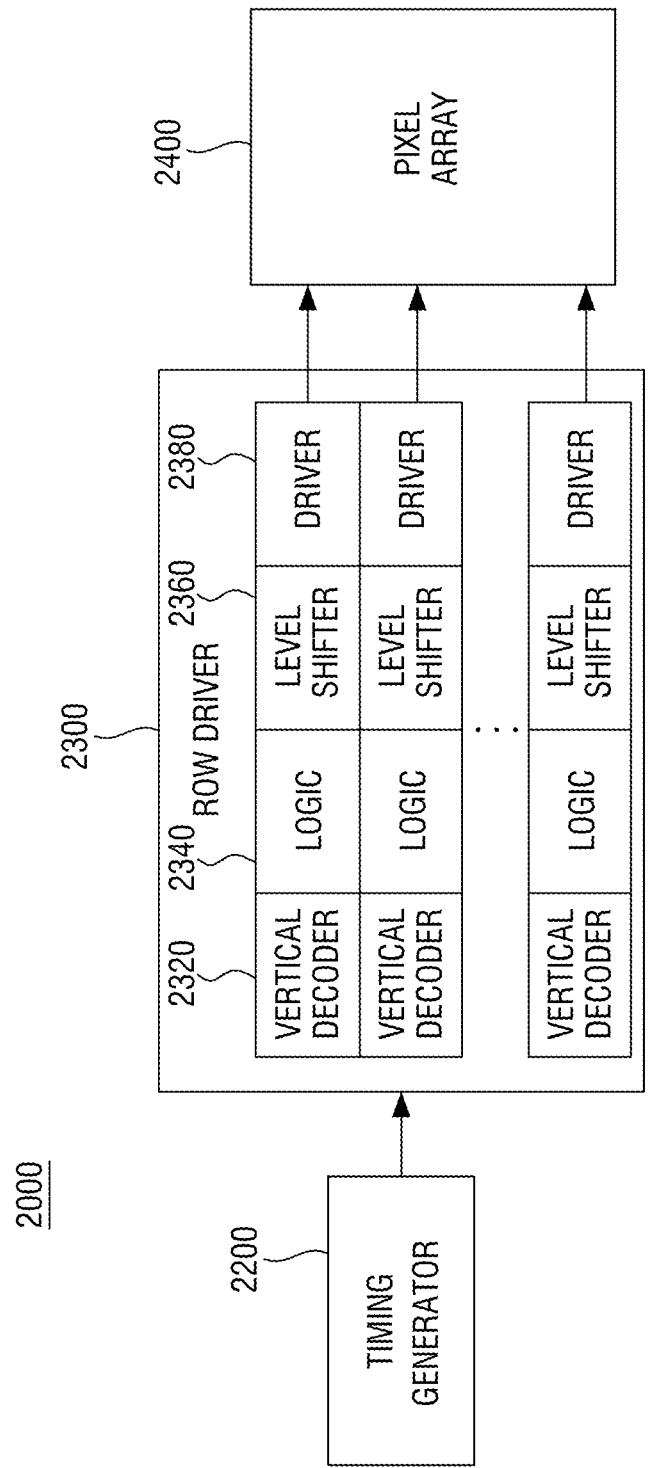
FIG. 15 is a block diagram of a semiconductor device according to some embodiments.

FIG. 15 is a block diagram of a semiconductor device 2000 according to some embodiments.

Referring to FIG. 15, the semiconductor device 2000 may include, for example, an image sensing device that converts an optical image into an electrical signal.

The semiconductor device 2000 may include a timing generator 2200, a row driver 2300, and a pixel array 2400.

The timing generator 2200 may generate a signal which is a reference for operation timing of various components of the image sensing device. The operation timing reference signal generated by the timing generator 2200 may be transmitted to the row driver 2300 and an analog-to-digital converter, a ramp signal generator, etc. not illustrated in the drawing.

The pixel array 2400 may sense an external image. The pixel array 2400 may include a plurality of pixels (or unit pixels). The row driver 2300 may selectively activate rows of the pixel array 2400.

The row driver 2300 may include vertical decoders 2320, logic units 2340, level shifters 2360, and drivers 2380.

The row driver 2300 may receive the operation timing reference signal generated by the timing generator 2200.

Each of the logic units 2340 may provide an enable signal to a level shifter 2360 according to the decoding result of a vertical decoder 2320.

Each of the level shifters 2360 may be enabled by the enable signal and provide an output signal, whose level has been changed, to a driver 2380. For example, the level shifters 100 and 200 described above may be employed as the level shifters 2360.

Each of the drivers 2380 may correct the signal output from a level shifter 2360 and input the corrected signal to the pixel array 2400.

In concluding the detailed description, those skilled in the art will appreciate that many variations and modifications may be made to the example embodiments without substantially departing from the principles of the present invention. Therefore, the disclosed example embodiments of the invention are used in a generic and descriptive sense only and not for purposes of limitation.

What is claimed is:

1. A level shifter comprising:
   an input circuit configured to generate and output first and second intermediate signals based on an input signal that transitions between a first voltage level and a second voltage level;
   a feed forward circuit configured to receive the first intermediate signal from the input circuit and generate and output a third intermediate signal enabled in a part of a period in which the first intermediate signal is enabled and to receive the second intermediate signal from the input circuit and generate and output a fourth intermediate signal enabled in a part of a period in which the second intermediate signal is enabled; and
   a level shifting circuit configured to receive the first and second intermediate signals from the input circuit and the third and fourth intermediate signals from the feed forward circuit and to shift the input signal to an output signal that transitions between a third voltage level and the second voltage level, wherein the third voltage level is different from the first voltage level.

2. The level shifter of claim 1, wherein a time when the first intermediate signal is enabled is faster than a time when the third intermediate signal is enabled, and a time when the second intermediate signal is enabled is faster than a time when the fourth intermediate signal is enabled.

3. The level shifter of claim 2, wherein a time when the first intermediate signal is disabled is substantially the same as a time when the third intermediate signal is disabled, and a time when the second intermediate signal is disabled is substantially the same as a time when the fourth intermediate signal is disabled.

4. The level shifter of claim 1, wherein the feed forward circuit comprises:
   a first delay unit that is configured to receive the first intermediate signal, delay the first intermediate signal for a predetermined time, and output the delayed first intermediate signal; and
   a first AND gate that is configured to perform a first AND operation on the first intermediate signal and the delayed first intermediate signal and to output a result of the first AND operation as the third intermediate signal.

5. The level shifter of claim 4, wherein the feed forward circuit further comprises:
   a second delay unit that is configured to receive the second intermediate signal, delay the second intermediate signal for a predetermined time, and output the delayed second intermediate signal; and
   a second AND gate that is configured to perform a second AND operation on the second intermediate signal and the delayed second intermediate signal and to output a result of the second AND operation as the fourth intermediate signal, and
   wherein the level shifting circuit comprises a first feed forward transistor that is gated based on the third intermediate signal and is configured to provide the second intermediate signal to the level shifting circuit.

6. The level shifter of claim 5,
   wherein the level shifting circuit further comprises a second feed forward transistor that is gated based on the fourth intermediate signal and is configured to provide the first intermediate signal to the level shifting circuit, and
   wherein the input circuit comprises a transistor having a size smaller than that of each of the first feed forward transistor and the second feed forward transistor.

7. The level shifter of claim 1,
   wherein the third voltage level is greater than the first voltage level,
   wherein the input circuit comprises a first inverter that is configured to generate the first intermediate signal by inverting the input signal, and
   wherein a threshold voltage of a transistor included in the first inverter is smaller than a threshold voltage of a transistor included in the level shifting circuit.

8. The level shifter of claim 1,
   wherein the third voltage level is greater than the first voltage level,
   wherein the input circuit comprises a first inverter that is configured to generate the first intermediate signal by inverting the input signal and a second inverter that is configured to generate the second intermediate signal by inverting the first intermediate signal, and
   wherein a threshold voltage of a transistor included in each of the first inverter and the second inverter is substantially the same as a threshold voltage of a transistor included in the level shifting circuit.

9. A level shifter comprising:
   a first pull-down transistor that is gated based on a first intermediate signal generated by inverting an input signal that transitions between a first voltage level and a second voltage level and is configured to pull down a voltage level of a first node to the second voltage level;
   a second pull-down transistor that is gated based on a second intermediate signal generated by inverting the first intermediate signal and is configured to pull down a voltage level of a first output node to the second voltage level;
   a first pull-up transistor that is gated based on the voltage level of the first node and is configured to pull up the first output node to a third voltage level greater than the first voltage level;

a first feed forward transistor that is gated based on a third intermediate signal generated by delaying the first intermediate signal and is configured to provide the second intermediate signal to the first node; and a second feed forward transistor that is gated based on a fourth intermediate signal generated by delaying the second intermediate signal and is configured to provide the first intermediate signal to the first output node.

10. The level shifter of claim 9, wherein a time when the first intermediate signal is enabled is faster than a time when the third intermediate signal is enabled, and a time when the first intermediate signal is disabled is substantially the same as a time when the third intermediate signal is disabled.

11. The level shifter of claim 10, wherein a time when the second intermediate signal is enabled is faster than a time when the fourth intermediate signal is enabled, and a time when the second intermediate signal is disabled is substantially the same as a time when the fourth intermediate signal is disabled.

12. The level shifter of claim 9, further comprising a third pull-down transistor that is gated based on an inverted voltage level of the voltage level of the first output node and is configured to pull down the first node to the second voltage level.

13. The level shifter of claim 12, further comprising:
a first keeper transistor that is gated based on the voltage level of the first output node and is configured to maintain the first node at the third voltage level; and
a second keeper transistor that is gated based on the inverted voltage level of the voltage level of the first output node and is configured to maintain the first output node at the second voltage level.

14. The level shifter of claim 13, further comprising first and second transistors that are configured to invert the voltage level of the first output node and provide the inverted voltage level to a second output node.

15. The level shifter of claim 9, wherein each of the first pull-up transistor and the second pull-down transistor comprises a fin field-effect transistor (FinFET), and a number of fins overlapped by a gate electrode of the first pull-up transistor is the same as a number of fins overlapped by a gate electrode of the second pull-down transistor.

16. The level shifter of claim 9, further comprising:
a first transistor that is configured to generate the first intermediate signal; and
a second transistor that is configured to generate the second intermediate signal, wherein a threshold voltage of the first transistor is smaller than a threshold voltage of the second feed forward transistor.

17. The level shifter of claim 16, wherein each of the first transistor and the second pull-down transistor comprises a FinFET, and a number of fins overlapped by a gate electrode of the first transistor is smaller than a number of fins overlapped by a gate electrode of the second pull-down transistor.

18. A level shifter comprising:
a first transistor that is configured to receive an input signal that transitions between a first voltage level and a second voltage level and to generate a first intermediate signal by inverting the input signal;
a second transistor that is configured to receive the first intermediate signal and to generate a second intermediate signal by inverting the first intermediate signal;
a first pull-down transistor that is gated based on the first intermediate signal and is configured to pull down a voltage level of a first node to the second voltage level;
a second pull-down transistor that is gated based on the second intermediate signal and is configured to pull down a voltage level of a first output node to the second voltage level;
a first pull-up transistor that is gated based on the voltage level of the first node and is configured to pull up the first output node to a third voltage level different from the first voltage level;
a first feed forward transistor that is gated based on a third intermediate signal and is configured to provide the second intermediate signal to the first node; and
a second feed forward transistor that is gated based on a fourth intermediate signal and is configured to provide the first intermediate signal to the first output node,
wherein a threshold voltage of the first transistor is smaller than a threshold voltage of the second pull-down transistor.

19. The level shifter of claim 18, wherein the threshold voltage of the first transistor is 0.5 to 1 volts (V), and the threshold voltage of the second pull-down transistor is 1 to 1.5 V.

20. The level shifter of claim 18, wherein each of the second transistor and the first pull-down transistor comprises a FinFET, and a number of fins overlapped by a gate electrode of the second transistor is smaller than a number of fins overlapped by a gate electrode of the first pull-down transistor.

* * * * *